United States Patent [19]

Lane et al.

[11] Patent Number: 5,061,838

[45] Date of Patent: Oct. 29, 1991

[54] TOROIDAL ELECTRON CYCLOTRON RESONANCE REACTOR

[75] Inventors: Barton G. Lane, Belmont; Herbert H. Sawin, Lexington; Donna L. Smatlak, Arlington, all of Mass.

[73] Assignee: Massachusetts Institute of Technology, Cambridge, Mass.

[21] Appl. No.: 370,594

[22] Filed: Jun. 23, 1989

[51] Int. Cl.$^5$ .................. B23K 9/00; C23C 14/22; C23C 14/00
[52] U.S. Cl. .................. 219/121.59; 219/121.43; 219/121.42; 156/345; 204/298.17; 204/298.37; 204/298.38
[58] Field of Search .................. 219/121.59, 121.92, 219/121.43, 123; 156/643, 646, 345; 29/576; 315/111.21, 111.41; 204/298.17, 298.37, 298.38

[56] References Cited

U.S. PATENT DOCUMENTS

| | | | |
|---|---|---|---|
| 4,401,054 | 8/1983 | Matsuo et al. | 118/723 |
| 4,431,898 | 2/1984 | Reinberg et al. | 219/121.43 |
| 4,511,593 | 4/1985 | Brandolf | 427/37 |
| 4,543,465 | 9/1985 | Sakudo et al. | 315/11.41 |
| 4,564,997 | 1/1986 | Matsuo et al. | 29/576 |
| 4,609,428 | 9/1986 | Fujimura | 156/643 |
| 4,718,976 | 1/1988 | Fujimura | 204/298.38 |
| 4,738,748 | 4/1988 | Kisa | 204/298.38 |
| 4,745,337 | 5/1988 | Pichot et al. | 219/121.43 |
| 4,859,908 | 8/1989 | Yoshida et al. | 315/111.41 |

FOREIGN PATENT DOCUMENTS

| | | |
|---|---|---|
| 0047663 | 3/1982 | European Pat. Off. ........ 219/121.43 |
| 0273741 | 7/1988 | European Pat. Off. |
| 57-76844 | 5/1982 | Japan |
| WO90/10547 | 9/1990 | PCT Int'l Appl. |

OTHER PUBLICATIONS

"Electron Cyclotron Resonance Microwave Discharges for Etching and Thin-film Deposition", J. Asmussen, *J. Vac. Sci. Technol. A*, vol. 7, No. 3, May/Jun., 1989, pp. 883-893.
"The Magnetic Mirror Approach to Fusion", R. F. Post, *Nuclear Fusion*, vol. 27, pp. 1579-1739.
*The Physics and Technology of Ion Sources*, "Electron Cyclotron Resonance Ion Sources", Jongen et al., I. G. Brown, ed., 1989, pp. 207-228.
"ECR Plasma in Poloidal Heliotron Type Magnetic Field", Sakamoto, Y., *Japanese Journal of Applied Physics*, vol. 16, No. 8 Aug. 1977, pp. 1409-1415.
"ECR Microwave Plasma Etch System", *Solid State Technology*, Feb. 1989, pp. 47-48.
"Status of ECR Source Technology", C. M. Lyneis, 9/87, pp. 254-258.

*Primary Examiner*—M. H. Paschall
*Attorney, Agent, or Firm*—Hamilton, Brook, Smith & Reynolds

[57] ABSTRACT

A toroidal ECR reactor is described in which a poloidal magnetic field is established in a plasma generating chamber in which a specimen to be processed is disposed on an electrode in a specimen chamber. Microwaves and gaseous reactants are introduced into the plasma generating chamber. A plasma discharge occurs in which high energy electrons are confined in a plasma source region extending between a magnetic mirror formed in the specimen chamber out of line-of-sight to the wafer(s) when disposed on the electrode. A baffle region formed between the two chambers prevents microwaves from entering the specimen chamber. The reactor is particularly suitable for etching or depositing films on semiconductor substrates, since the sensitive substrates are not exposed to the high energy ions and-/or photons of the source region.

33 Claims, 7 Drawing Sheets

TOROIDAL ELECTRON CYCLOTRON RESONANCE REACTOR

FIELD OF THE INVENTION

The present invention relates to magnetically confined plasmas heated by microwaves for use in materials processing.

BACKGROUND ART

ECR (Electron Cyclotron Resonance) plasma sources are in much use for the generation of charged ion beams for accelerators and atomic physics experiments. Additionally, an important industrial application of ECR sources has developed in the field of semiconductors in which ECR sources have been used for a variety of processes required in the fabrication of integrated circuits.

A typical ECR reactor consists of a source chamber and a specimen chamber. A set of solenoidal electromagnets produces a magnetic field in the source chamber. Microwave energy and a reactant gas are introduced into the source chamber. The interaction between the microwave field and the magnetic field in the presence of the reactant gas dissociates the gas and produces a plasma. The "plasma" consists of charged ions, electrons, excited neutrals, free radicals, atoms, and other neutrals.

Typically, the magnetic field is designed to produce a magnetic mirror that confines the plasma to a particular volume within the reactor called the source region (later defined with more generality). The magnetic flux density of the field generated in the source chamber is adapted to establish electron cyclotron resonance within the chamber (i.e., 875 Gauss for 2.45 GHz excitations).

The plasma flows axially from the plasma source region into the specimen chamber along magnetic field lines where the plasma is applied to a specimen, such as a semiconductor wafer, thereby depositing, etching, or modifying the wafer with the dissociated reactants or ionized particles.

The specimen chamber includes an electrode upon which the specimen is mounted for processing. Typically, the electrode is centered perpendicular to the axis of symmetry of the magnetic field immediately below the source chamber. Hence, specimens in the specimen chamber are exposed to a line-of-sight view of the plasma source region.

ECR sources have proven useful in semiconductor processing for tasks such as plasma deposition, plasma etching, reactive ion etching, amorphizing, oxidizing and doping.

A significant advantage of ECR sources is the ability to produce a plasma discharge without cathodes so that only the material injected into the source is consumed. Therefore, ECR sources can operate continuously for long time periods and maintenance is minimal.

Despite these advantages, a number of problems still remain to be solved in the use and application of ECR sources for semiconductor processes. These problems include, inter alia, non-uniformity of application of the plasma over the specimen (wafer) surface, exposure of the wafer to damaging high-energy photon radiation and non-directional plasma fluxes resulting in pattern dependencies when etching submicron features.

SUMMARY OF THE INVENTION

An ECR reactor is provided in accordance with the present invention which produces a highly directional and uniform plasma discharge over the wafer while minimizing wafer exposure to high-energy photon radiation. The chamber consists of a plasma generating chamber and a specimen chamber coupled together by a baffle section. Electromagnetic coils create a poloidal D.C. magnetic field which passes through the plasma generating chamber. A poloidal magnetic field is a magnetic field in which all field lines lie on planes whose intersection defines a common center line. The field extends through the baffle section into the specimen chamber where it penetrates an electrode which supports a semiconductor wafer for processing.

A microwave source provides microwave energy to the plasma generating chamber. Reactant gasses flow into the plasma generating chamber. The interaction between the microwave fields' the reactant gas and the electrons gyrating about the D.C. magnetic field provided by the electromagnetic coils produces a plasma consisting of energetic electrons, photons, ions, free radicals, atoms and excited neutrals.

The high-energy ionizing electrons in the plasma are confined by a magnetic mirror to a source region within the plasma generating chamber. The plasma source region consists of that portion of the plasma which contains a large concentration of energetic electrons. By electron-impact with the neutrals, these energetic electrons produce the positive ions and electrons which sustain the plasma, as well as free radicals, atoms, and excited neutrals. This region typically emits the majority of high-energy photons. Cold electrons and ions stream from the source region along the magnetic field lines until they encounter the wafer mounted on the electrode.

This ECR reactor is particularly suitable for dry etching, since it increases the production of ions relative to radical species, thereby facilitating directional etching by large, low energy, ion fluxes while reducing sidewall etching by radical species. Exposure to high-energy photon radiation, energetic electrons or ions which are damaging to sensitive semiconductor devices is also minimized, since such radiation and particles are, for the most part, confined to the plasma generating chamber.

The use of a poloidal magnetic field in a ECR reactor to guide the plasma flux from the source region to the sample without the sample surface being exposed to the direct line-of-sight of the plasma source region differs from all known previous reactors.

A plasma sheath is created at the wafer, which accelerates the ions and also orients their direction at impact along the macroscopic normal of the wafer. Optional trim coils located beneath the electrode are provided to adjust the radial profile of the ion flux across the wafer.

In a preferred embodiment, the plasma generating chamber is located below the specimen chamber. Reactant gasses are introduced either into the lower chamber and/or the baffle region, to feed the discharge. A pumping system coupled to the upper chamber creates a pressure differential between the upper and lower chambers.

Auxiliary gasses, which may be in a neutral state or pre-dissociated by plasma discharge, can be sprayed directly onto the wafer, thereby reducing the mixing of this auxiliary gas with that of the plasma generating chamber.

A uniform plasma potential is maintained across magnetic field lines and, hence, across the wafer by "terminating" the fields on a conductive surface, i.e., a graphite wall in the plasma generating chamber.

The above and other features and advantages of the invention, will now be described in detail in connection with the drawings.

DETAILED DESCRIPTION OF THE INVENTION

I. The Reactor In General

Figure 1:
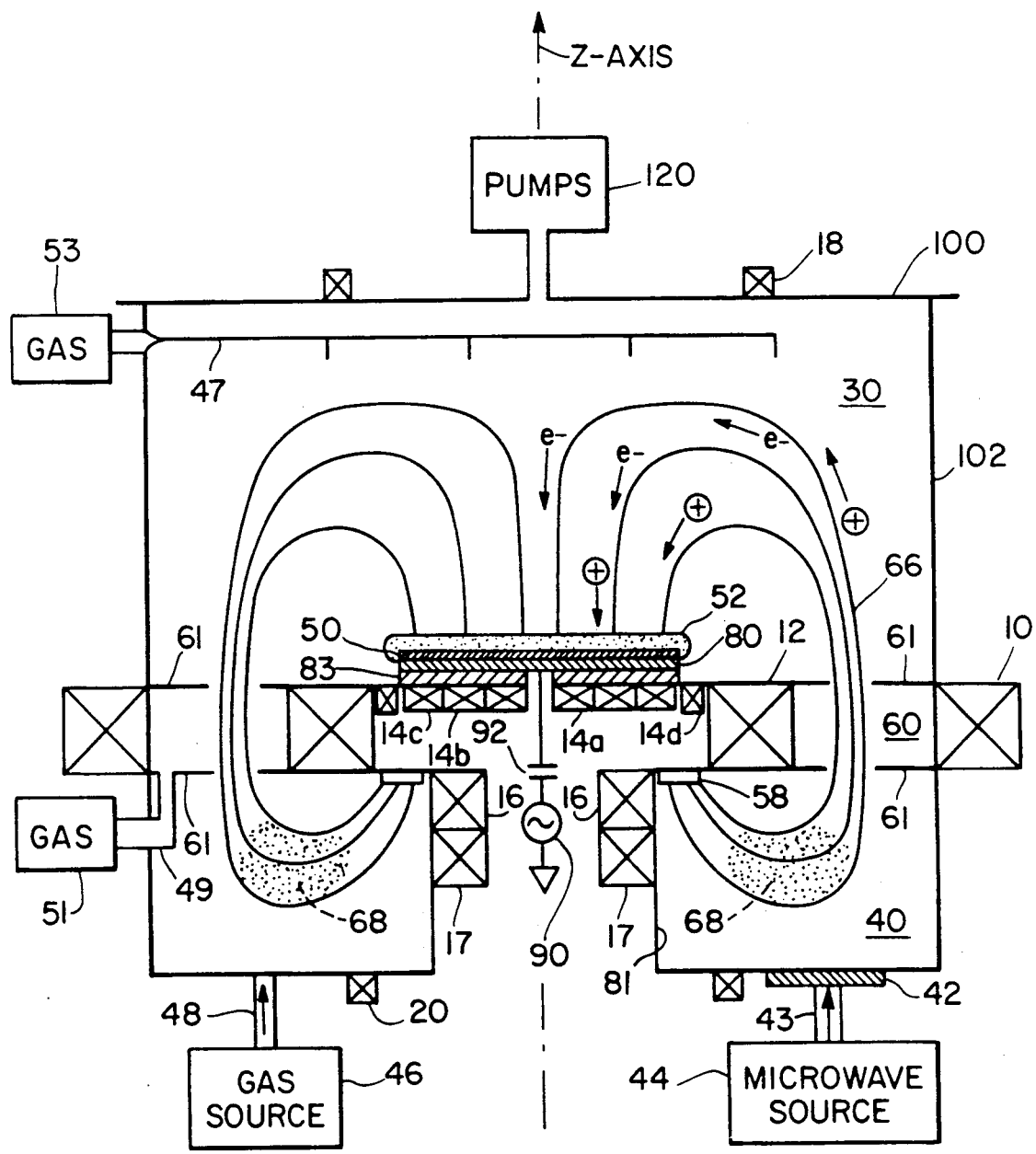
FIG. 1 is a schematic representation of a cross section of an ECR chamber in accordance with the present invention.

Referring now to FIG. 1, an ECR reactor 100, particularly suitable for plasma etching of specimens, such as semiconductor wafers 50, will now be described. Reactor 100 consists of a lower plasma generating chamber 40 and an upper specimen chamber 30 coupled together by a baffle region 60. The chamber 30 is comprised of a generally cylindrical metal wall 102 of non-ferritic stainless steel, or other suitable material.

The lower chamber 40 is toroidal in shape and is provided with window(s) 42 of microwave transparent material, such as quartz, for admitting microwave energy from microwave source 44 through waveguide 43 into the toroidal chamber 40. A source of gaseous reactants 46 is provided for introducing a suitable etchant element, such as $Cl_2$, into the chamber 40 via conduit(s) 48. Optional gas sources 51 and 53 are provided for directly introducing reactants via conduits 49 and 47, respectively, to baffle region 60 and chamber 30, respectively.

The solenoidal coil set shown in FIG. 1 is comprised of inner coil 12, outer coil 10, "mirror" coils 16 and 17, upper coil 18, lower coil 20 and trim coils 14a–d. These coils are used to provide a magnetic field configuration which is advantageous to the creation and control of the plasma and to guiding it along field lines to the wafer 50 while maintaining the plasma source region out of the line-of-sight of the wafer. The coil 12 provides a basic dipolar field which in the absence of the other coils would generate field lines which extended far outside of the vacuum chamber shown. The coil 10 is run with the current in the opposite direction to coil 12 and compresses the magnetic field lines due to coil 12 so that they pass through the baffle region 60 within the vacuum chamber. In the absence of the remaining coils, the field in the source chamber produced by coils 12 and 10 would be similar to the field shown schematically in the specimen chamber 30. The coils 16 and 17 raise the field at the termination plate 58 to a higher value than in the plasma source region 68, creating a "magnetic mirror" which improves the confinement of plasma. The coil 20 serves to compress the set of field lines which map from the wafer into the source region (i.e., flux bundle) by increasing the magnetic field strength in the source region. This coil controls the positioning of the resonance zone, the thickness and position of the flux bundle and, hence, the coupling between the microwave field in the source chamber 40 and the plasma in the source region 68. The coil 18 aids in shaping the flux bundle into the specimen chamber. Finally, the coils 14a,b,c,d are uniformity trim coils which control the detailed structure of the magnetic field at the wafer surface. By varying the current through these coils, the angle of the magnetic field with the wafer and the variation of the amplitude of the magnetic field strength (i.e., modulus B) across the wafer can be controlled.

Microwaves at 2.45 GHz and reactant gas are introduced via window(s) 42 and conduits 48 and/or 49, respectively, to form an ECR plasma. High-energy ionizing electrons in the plasma are largely confined in the source region 68, by the magnetic mirror in chamber 40. But, the cold electrons $e^-$ and ions $\oplus$ stream along the field lines 66 into the upper chamber 30 and impinge on the wafer 50. An electric sheath field 52 is formed at the wafer which accelerates the cold ions $\oplus$ and creates an ion flux directed normal to the wafer surface. Uniformity trim coils 14a, b, c and d immediately beneath and around electrode 80 permit the adjustment of the magnetic field to create a uniform ion flux and etching rate. If ion bombardment energies greater than approximately 20 eV are desired, the wafer can be powered with radio frequency power from rf source 90 coupled to the electrode 80 via capacitor 92 to create additional biasing. The specimen chamber 30 is maintained at approximately one-half the baffle region pressure by pumps 120 to reduce the neutral flux to the surface and the scattering in the specimen chamber.

II. The Magnetic Fields

Figure 2:
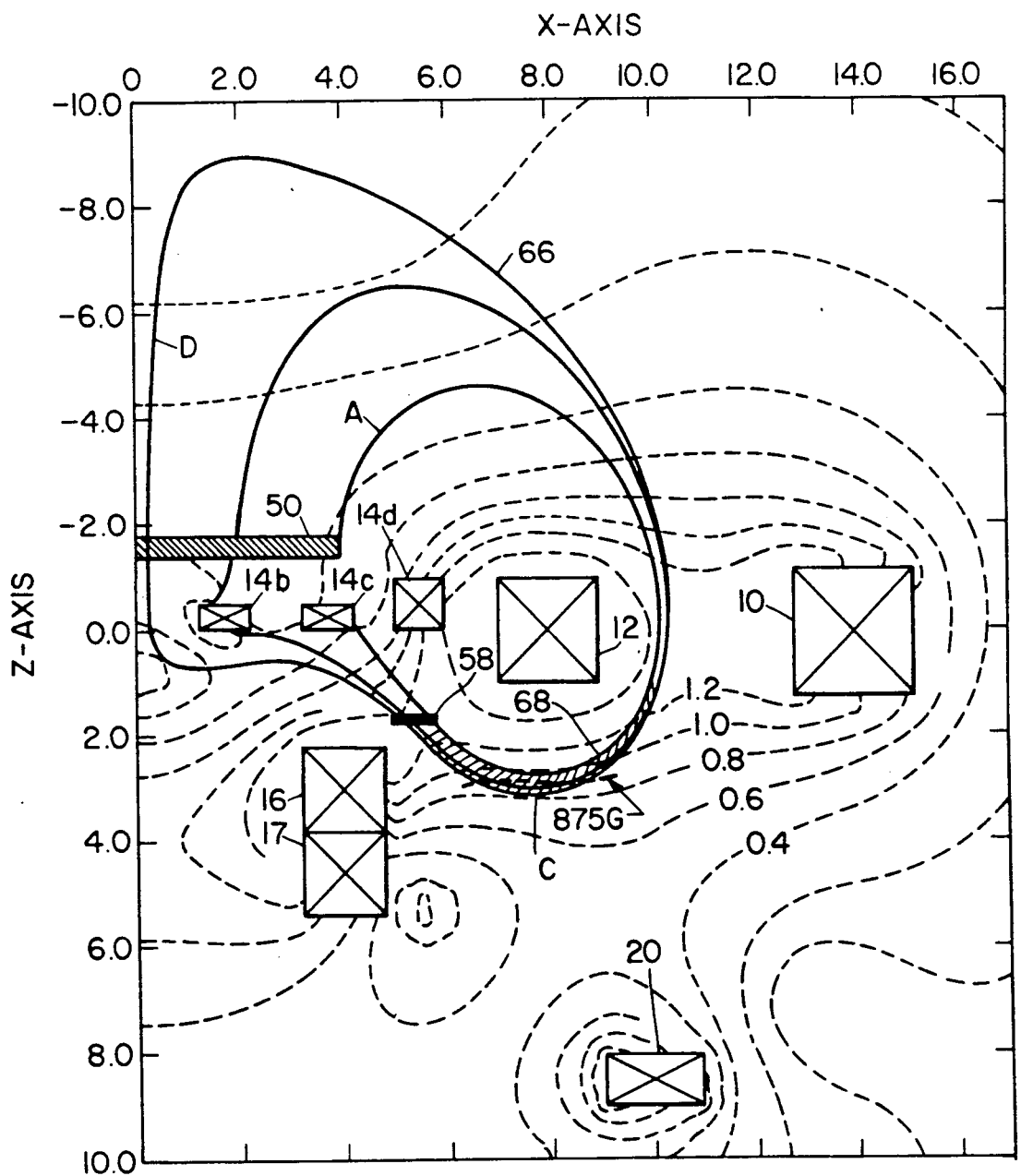
FIG. 2 is a diagram showing the magnetic field lines (solid) and modulus B contours (dotted) generated by the coil set given in Table 1.

Table 1 below gives the coil locations and currents for a specific realization of the reactor shown conceptually in FIG. 1. The coil numbering refers to the labels of FIG. 1 and the magnetic field lines and modulus B contours resulting from the configuration given in Table 1 are displayed in FIG. 2. The coils are all solenoidal loops centered on a common axis of symmetry and produce a purely poloidal field, as shown in FIG. 2.

TABLE 1

| 1<br>Coil # | 2<br>z | 3<br>$r_{centroid}$ | 4<br>δz | 5<br>δr | 6<br>J |
| --- | --- | --- | --- | --- | --- |
| 12 | 0.0 | 8.0 | 2.0 | 2.0 | 9000. |
| 10 | 0.0 | 14.0 | 2.4 | 2.4 | −4000. |
| 16 | 3.0 | 4.0 | 1.6 | 1.6 | −6000. |
| 17 | 4.6 | 4.0 | 1.6 | 1.6 | −2000. |
| 20 | 8.5 | 10.0 | 1.0 | 1.0 | −6000. |
| 18 | −16.0 | 7.5 | 1.0 | 1.0 | 500. |
| 14a | −0.25 | 1.75 | 0.5 | 1.0 | 6000. |

TABLE 1-continued

| Coil # | z | $r_{centroid}$ | $\delta z$ | $\delta r$ | J |
|---|---|---|---|---|---|
| 14b | −0.25 | 2.75 | 0.5 | 1.0 | 0000. |
| 14c | −0.25 | 3.75 | 0.5 | 1.0 | 1000. |
| 14d | −0.5 | 5.5 | 1.0 | 1.0 | −2000. |

The above table gives the coil locations and currents for the field lines and modulus B contours shown in FIG. 2. The coil numbers in the first column refer to the labels in FIG. 1. The z axis is the axis of azimuthal symmetry. The coils are all solenoids whose centers lie on the z axis. The second column gives the position of the center of the coil along the z axis, the third column gives the radius of the coil cross-section centroid, the fourth column gives the axial width of the coil along the z axis, the fifth column gives the radial width of the coil, and the sixth column gives the current density of the coil in $A/in^2$. The dimensions for the coil locations are in inches. The coil currents shown are for a typical case.

FIG. 2 shows the field lines (solid lines) and modulus B contours (dotted lines) generated by the coil set given in Table 1. Note that the set of coils at z=16.0 lie outside and are not shown in this figure. The figure is azimuthally symmetric about the z axis, and x is the radial coordinate. All dimensions are in inches and the modulus of B is in kiloGauss. The vacuum chamber 100 is not shown in this figure, but the magnet locations are shown in solid and labelled as in FIG. 1. The wafer 50 is presumed to be mounted in the z=−1.75 plane and to have a radius of 4 inches. The field lines 66 shown are sample field lines which map to the wafer 50 (dotted lines) and, in particular, the field line A that intersects the specimen at x=4, z=−01.75 and the line D at x=0.25, z=−01.75 aid in delineating the edge of the set of field lines in the source region 68 that map to the wafer, i.e., the flux bundle.

Figure 3:
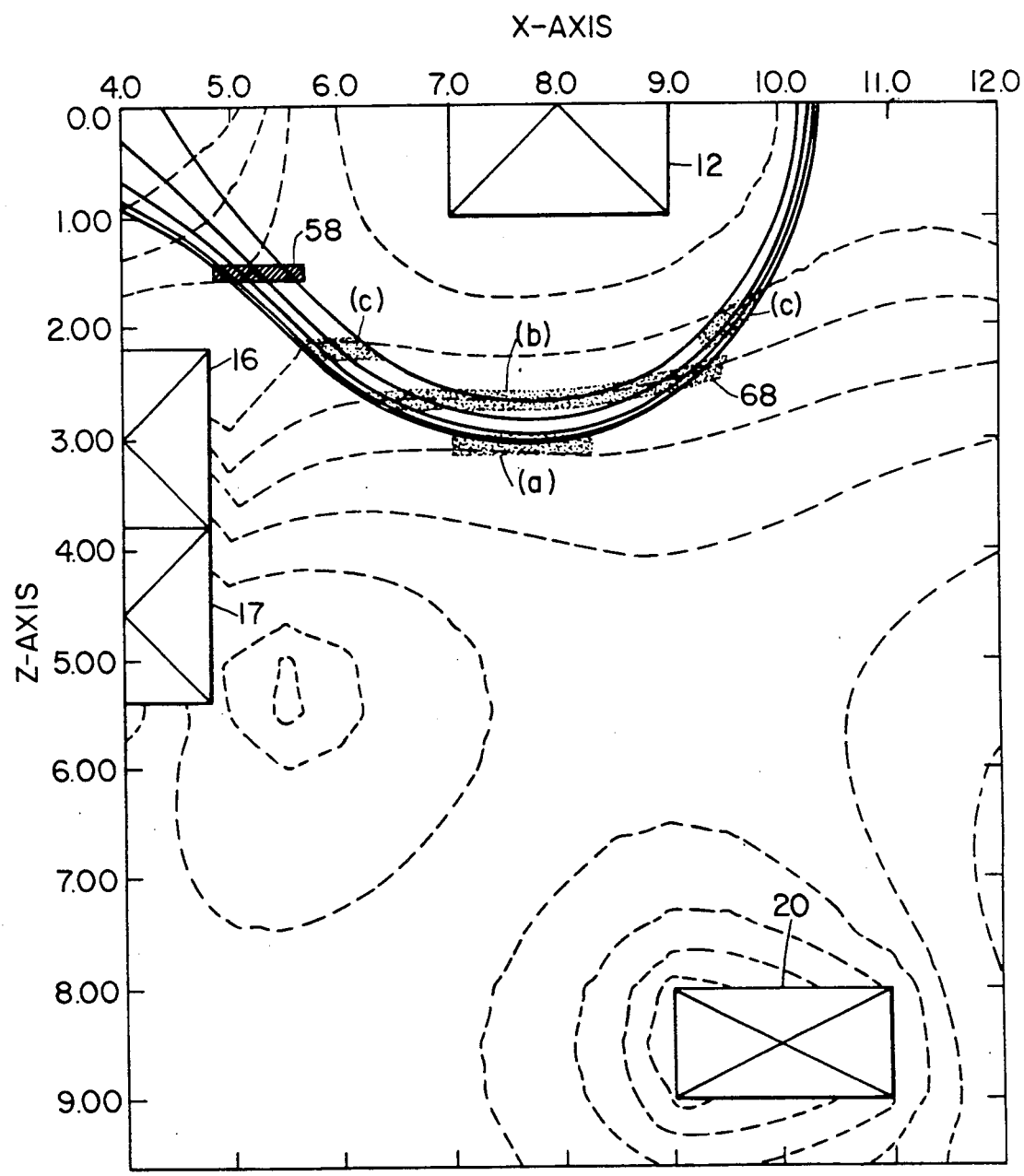
FIG. 3 is a diagram showing the details of the magnetic field lines and modulus B contours in the source region of FIG. 2.

FIG. 3 shows an enlarged view of the magnetic field lines and modulus B contours in the source region 68 of FIG. 2. The source region 68 in FIG. 3 is that volume defined by the set of field lines which map to the wafer (i.e., the flux bundle) and which lie between the termination plate 58 and the baffle region 60. Note that the vertical axis is at x=4 inches and is not the axis of symmetry which is at x=0. As the currents in the coils are increased by a common factor, the positions of the field lines and modulus B contours remain the same; the modulus B contours, however, take on different values. Thus, the modulus B contour denoting the location of resonance location at 875 G can be shifted with respect to the flux bundle. The dotted regions schematically denote the location of the resonance zone for three coil current settings in which the coil currents shown in Table 1 have been multiplied by a common factor. The position of the resonance zone is significant because the microwave fields couple in the resonance zone to the cyclotron gyration of the electrons leading to efficient heating. In (a), the resonance zone is positioned such that it is tangent to the flux bundle on the outside. This means that only field lines which map to the center of the wafer intersect the resonant zone leading to increased plasma production on these field lines relative to field lines which map to the wafer edge. In (b), the resonance zone is tangent to the flux bundle on the inside. In this situation, the entire flux bundle intersects the resonance zone, but heating is strongest on those field lines which are tangent to the resonance zone. This is because, as electrons are heated by the microwave fields, they remain within the resonance zone as they are heated if the field is tangent to the resonance zone. In contrast, when the field line is not tangent to the resonance zone, the electrons which are heated by the microwaves only remain within the resonance zone for part of their bounce period. In (c), the resonance zone cuts across the entire flux bundle at approximately the same angle (in this case in two locations) leading to uniform plasma production across the flux bundle.

III. Advantages of the Invention

Returning now to FIG. 1, some of the advantages of the invention will now be summarized in connection therewith. The reactor 100 optimizes the uniform flux of low-energy ions to the wafer 50. The neutral radical flux is reduced by the differential pumping of the wafer chamber and by the high electron energies of the magnetic mirror ECR source. High electron energies increase the production of ions relative to radicals in electron impact processes. The ion bombardment flux ($>10$ mAmp/$cm^2$) (where desired) and energy (from 20 eV or greater using rf biasing) are comparable to that of a conventional ECR reactor which uses an axial magnetic mirror. Unlike parallel-plate and Reactive Ion Etching (RIE) etchers, which have an order of magnitude less ion bombardment and greater neutral pressures, a major fraction of elemental flux to the wafer in the present reactor is ions. The reduction of radical species striking the wafer minimizes sidewall etching, thereby reducing the need for sidewall passivation in achieving anisotropic etching. Assuming an etching yield of one, an etching rate of over 1 micron/min can be achieved. The system is most appropriate for polysilicon, single crystal silicon, and metal etching, since these processes require low-energy ion bombardment. The use of low-energy ions permits the maintenance of high selectivities, with respect to the photoresist and to the underlying films. Oxide etching using reactant gasses, such as $CHF_3$, can be performed with significant rf biasing to increase the ion bombardment energy.

High-energy photon radiation, which can induce defects within oxides formed on wafer 50, is minimized, since the glow discharge is confined to a source region 68 within the lower chamber 40 which is out of the line-of-sight to the wafer 50. It has been demonstrated in conventional dry etching processes that charged and neutral traps are created in an oxide which is exposed to the radiation of a plasma process. Although the charged traps are neutralized in low temperature anneals, such as those used in sintering metals, neutral defects still remain as they cannot be annealed at low temperatures. Light-piping of UV radiation has been demonstrated to channel radiation impinging on the source and/or drain region into the oxide underlying the gate of a MOS transistor. The long-term reliability of short channel devices (in which hot electrons can penetrate the gate oxide and charge neutral traps) is not presently well understood; therefore, processes which avoid the radiation exposure are desirable.

As stated earlier, plasma sheath 52 is formed at the wafer 50. The ions ⊕ which follow the field lines 66 to the sheath 52, have little kinetic energy and, therefore, are oriented by the sheath electric field to impinge on the wafer 50 along the macroscopic normal of the wafer. The sheath width is on the order of 1 mm in thickness or much less than 0.1 of a mean free path. The ions suffer few collisions in crossing this thin sheath and are highly directed. It has been demonstrated that pattern dependencies, such as Reaction Ion Etching "RIE lag" (which cause smaller features to etch at rates differing from larger features), are reduced by thin sheaths in which the highly directed ion flux minimizes sidewall scattering. The relatively collisionless sheaths of the present invention reduce pattern dependencies presently encountered in the application of existing dry etching processes to submicron features.

As previously noted, the present invention eliminates the problem of UV radiation of the wafer by confining the glowing portion of the discharge to a source region 68 within the source chamber. The UV radiation from a plasma is due to the higher energy electrons ($\geq 10$ eV) which are, in general confined magnetically to the source region. This is because the heating by resonant microwaves tends to increase the particle pitch angle, trapping the electron in the magnetic well where it continues to interact with the microwave resonance and gain further energy. These electrons are lost either by inelastic collisions with neutrals which lower their energy, or by pitch angle collisions which scatter them into the "loss cone".

The currents in coil 16 are adjusted so that the magnetic field at the baffle region 60 between the wafer and source chambers 30 and 40, is higher than the magnetic field at the plasma termination wall 58 in the source chamber 40. Thus, when high-energy electrons pitch angle scatter, they preferentially are lost to the plasma termination plate 58 (a graphite or ceramic plate mounted on the vacuum vessel wall where the field lines penetrate the vacuum vessel), rather than to the specimen chamber.

A sufficiently high local neutral pressure may be maintained in the baffle region 60, such that escaping energetic electrons and ions lose their directed velocity out of the source region, and are cooled by inelastic collisions before they enter the wafer chamber. For example, baffles 61, in the form of graphite rings, may be installed between the source and specimen chambers to form a baffle region 60, allowing a baffle opening of 2 cm (the flux bundle at the baffle has a radial width of approximately 1 cm). Pumping ports with a diameter of 10 inches would allow a 2:1 pressure differential between the baffle region and the specimen chamber 30.

The baffles 61 also serve to contain the microwave fields to the lower source region 40. The electric fields outside the lower chamber are reduced by the ratio of the area of the baffle opening to the surface area of the walls. Additional reduction of the transmission of microwaves through the baffle occurs because of the dense plasma in the baffle region. This results in a substantial attenuation of the microwave fields, thus avoiding the undesirable presence of microwave fields near the wafer.

Because the plasma is confined radially by the magnetic field, it makes contact with material objects only at the field line ends and at the plasma flux bundle edges. The baffles in the baffle region 60 which define the bundle edges are made of non-erodable/non-objectionable materials, such as graphite. Since the field lines "end" on the wafer 50, and on a well-defined termination plate 58 in the source chamber 40 at the other end, and contact only the baffles, the impurity levels and types can be easily controlled.

A unique feature of the present invention is that etching uniformity is obtained independently of the ECR discharge conditions and of the plasma chemistry. The uniformity can be controlled either with the uniformity trim coils 14, mounted underneath and/or around the wafer 50, or by dynamic variation of the ECR resonance zone location.

In the uniformity trim solenoid coils approach, the coils located underneath and/or around the wafer are used to control the mapping of the source region to the wafer. In the absence of cross-field transport, continuity of particle flux requires that the particle flux parallel to the field vary in proportion to modulus B, i.e., the modulus of the magnetic field B. This is due to the expansion and contraction of a magnetic flux bundle as modulus B varies along its length. Thus, by adjusting modulus B across the face of the wafer, we can adjust the flux to the wafer. If the flux is radially uniform at the baffle region 60, a coil configuration is used in which the ratio of $B_{baffle}$ to $B_{wafer}$ is approximately constant. If the flux near the baffle region is peaked on "outer" field lines leading to a larger ion flux at the wafer center, the coil currents in the trim coils can be decreased, thus decreasing the ion flux density to the wafer center. Note that this control mechanism is orthogonal to the control of the resonance location which is described below, and thus could be used either by itself or in conjunction with the resonance location control.

In another approach to uniformity, the radial profile of the plasma impinging on the wafer may be modified by controlling the density profile of the plasma source; this is accomplished by tailoring the heating profile. In this approach, the coupling between the microwave energy and the electrons is varied across the cross-section of the flux bundle by controlling the relative position of the resonance zone and the flux bundle. Microwave energy is most efficiently coupled to electrons in the resonance zone where the microwave frequency equals the electron-gyro-frequency; the coupling is most efficient on field lines which are tangent to the resonance zone since electrons remain in resonance as they are heated on these field lines. Unlike conventional axial ECR sources in which the resonance cuts across the flux bundle approximately at right angles, the relative position of the resonance zone and the flux bundle can be adjusted in the present reactor to increase electron heating and, hence, plasma production on field lines which map either to the center or the edge of the wafer. The relative position of the resonance zone in relation to the flux bundle is controlled by the coil currents. This has been described in more detail earlier for an example case in reference to FIG. 3.

By varying the coil currents, it is possible to selectively control the radial ionization profile; by dynamically varying the coil currents during the etching process, it is possible to achieve a time averaged uniformity that can be made extremely precise. Because the adjustment of the uniformity does not require a modification to the etcher itself, but only to the control program that directs the coil currents, a change of radial deposition profile to accommodate a new process chemistry is straight forward and does not require a vacuum break. As noted above this technique of dynamically varying the ion flux can be combined with the wafer trim coil approach also described above. The loop voltage drop induced around the circumference of an 8" wafer due to the changing magnetic flux through the wafer is approximately 30 mV if the coils are swept from 0 to full current in 0.1 seconds. Thus, wafer charging due to this technique is negligible.

Even without using these techniques, we anticipate that a high degree of uniformity will be present. The overall coil currents can be adjusted in order to render the source region of ionization as uniform as possible. Referring to FIG. 3 case (c), the currents in the coils have been uniformly reduced in order to place the resonance within the flux bundle in such a fashion as to maximize the uniformity of heating. Note that the resonant modulus B contour, which has been highlighted, cuts across the flux bundle in such a way that it intersects each field line at approximately the same angle. This means the heating will be the same on all field lines. As the plasma streams through the baffle region 60, the spatial uniformity is further increased by collisional mixing which is enhanced by the extreme radial compression of the flux bundle in the baffle region. Additional gas can be fed in at the baffle region, to further enhance this collisional mixing.

In the above system, only a small portion of the flexibility of this configuration is employed. Namely, the coil currents have been adjusted by an overall constant, keeping their relative ratios constant. This causes the flux bundle to remain the same spatially and only scales the modulus B every where by a constant. By changing the ratio of the coil currents, for example, by changing a single coil current, the shape of the flux bundle and the location of the resonance zone can be changed. The position of the flux bundle determines the interaction of the spatial microwave field pattern with the plasma, and the position of the resonance directly influences the coupling of the electro-magnetic fields to the plasma. Thus, the configuration promises great flexibility in controlling the spatial ionization profile and, thus, of the heating profile. This is to be contrasted to conventional ECR sources in which the spatial ionization profile is difficult to change.

It is necessary to form an over-dense plasma (i.e., an electron density n greater than the critical value $n_{crit} = 7.4 \times 10^{10}$ cm$^{-3}$) in the source chamber region. The creation of over-dense plasmas in ECR sources has been readily demonstrated in many experiments. Possible mechanisms include whistler wave heating, near-field or evanescent wave heating, or off-resonance heating. In all cases, the microwave electric field should be introduced perpendicular to the dc magnetic field, in order to achieve good heating (extraordinary mode).

Several different methods are available for coupling the microwave power into the plasma in this reactor. In the simplest technique, the microwave power can be coupled to the plasma via a vacuum waveguide window 42 on the bottom or side of the lower chamber, as shown in FIG. 1. The microwave fields reflect from the walls and fill the chamber. The electric field component, which is perpendicular to the magnetic field, is absorbed, but the parallel component is reflected, whereupon its polarization is changed and is then again partially absorbed.

Figure 4:
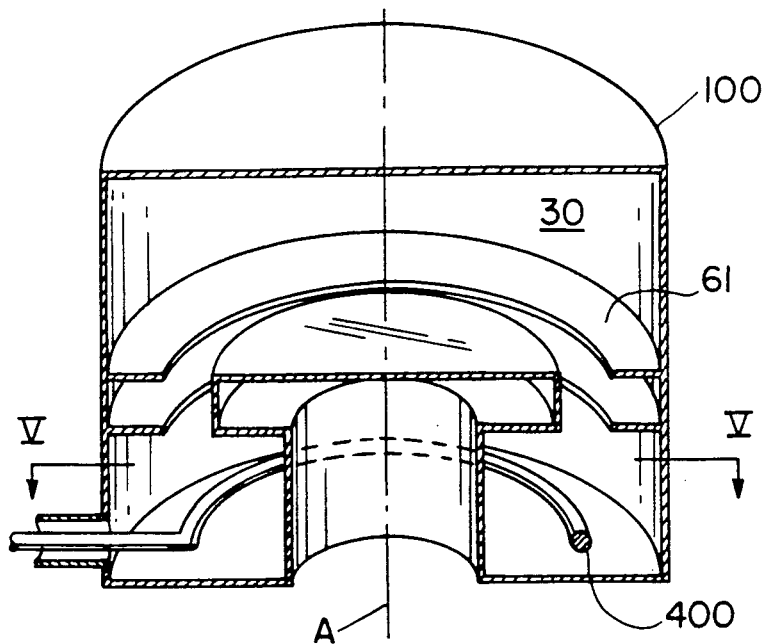
FIG. 4 is a schematicized partial perspective view of an ECR chamber showing the location of a microwave antenna structure within the chamber taken along lines IV—IV of FIG. 5.
Figure 5:
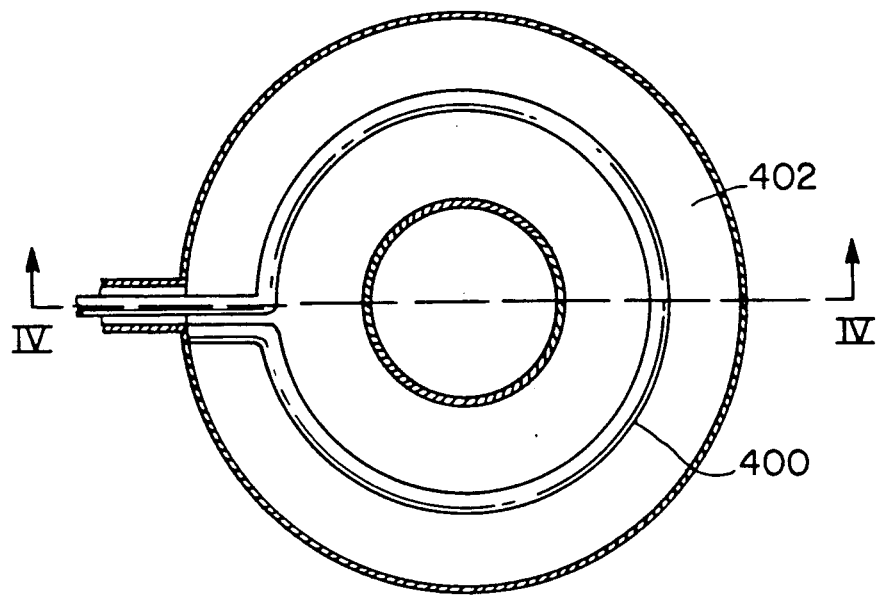
FIG. 5 is a plan view of the chamber of FIG. 4 taken along lines V—V of FIG. 4.

Alternatively, a coaxially-fed shorted loop antenna 400, coupled to a microwave energy source (not shown), as shown in FIGS. 4 and 5, can be used, wherein the loop 400 is disposed coaxial to the line of symmetry "A" established by the magnetic fields (not shown) within the reactor 100. Note: Like parts in FIGS. 4 and 5 retain the reference numerals used in FIG. 1. By locating the loop appropriately. high-field launch of the whistler mode is provided in order to achieve densities exceeding cutoff. The whistler mode is right-hand circularly polarized and propagates along the magnetic field. Typically, the wave is launched at high field, i.e., above the cyclotron resonant field (B=875 G for 2.45 GHz) and is damped at the cyclotron resonance. The whistler wave has the advantage of having no density limitations. The microwave discharge could be excited by a number of other methods not described here, e.g., multiple feed ports, array antennas, etc.

In addition to the above heating methods which have been used in conventional ECR sources, second harmonic heating could be used. Second harmonic heating excites electrons which have non-zero energy in regions where the magnetic field modulus is one-half that of the primary ECR resonance. For example, the primary resonance for 2.45 GHz microwaves occurs at a field line of 875 Gauss and a second harmonic resonance would occur at a field line of 437.5 Gauss. In the proposed configurations, secondary harmonic heating may be useful in creating a uniform, high density plasma source, or in the creation of higher energy electrons (e.g., >50 eV).

The reactor 100 has been described in terms of thin film etching, but it also has potential in the deposition of thin films. For example, growth of silicon, or other materials, may be performed using gasses typically employed in PECVD processes. The reactor would have several advantages in deposition. For example, large uniform fluxes of material could be transported to the surface in the form of low-energy ions. Also, it has been demonstrated that growth of materials from low-energy beams can facilitate the growth of crystalline materials at low temperature; and the differential pumping between the discharge 40 and the deposition 30 region should allow the introduction of additional deposition gasses to grow chemical compounds in a manner similar to reactive sputter deposition, but with potentially greater facility for process control.

One unique application which could be performed in conventional ECR reactors, but would be greatly benefited by the high-energy photon isolation, is the deposition of materials which use the "termination" wall as a source. By using low gas pressures in an ECR reactor, hot electron energies of 1 to 10 keV can be achieved. By allowing these energetic electrons to impinge on the terminating surface 58 of FIG. 1, for example, the termination wall can be sputtered/evaporated. For example, in using a termination wall of Al, the Al can be emitted from the termination wall. The emitted Al is rapidly ionized by the plasma in the plasma source region and is transported to the sample surface largely as ions. Thus, a physical vapor deposition process can be accomplished, similar to that conventionally being done by electron beam evaporation. The high-energy photons (x-rays) which strike the sample would be minimized by the proposed ECR reactor(s) of the invention. As the Al ion flux is highly directed, the deposition will also be directional and should be advantageous in electronic materials processing, such as "lift-off" patterning of thin films. Gasses could be added to this process to deposit materials which have differing composition than that of the termination wall. For example, silicon-aluminum alloys could be deposited on the wafer by adding $SiH_4$, via conduit 48, to a deposition process based on the transport of Al from the termination wall 58, FIG. 1.

The proposed reactor could also be used in the context of energetic ion implantation by pulsing the specimen to a large negative bias, thereby accelerating the impinging ions to high energy.

Suitable reactant gasses for etching of silicon are: $Cl_2$, $CF_4$, $C_2F_6$, to name a few. For $SiO_2$ deposition, $SiH_4$, $H_2$, $O_2$, and $N_2O$ may be employed. For ion implantation of dopants, $BF_3$ and $PF_3$ can be used.

IV. Other Embodiments

In conventional ECR reactors, the plasma source is created by the injection of microwaves into a magnetic field region along the axis of symmetry of the magnetic field. The plasma flows from this source region guided by the magnetic field lines to the sample surface which is centered at or near the axis of symmetry of the magnetic field. Various magnetic field schemes have been used in the sample region to produce a more uniform plasma flux at the sample surface.

In the proposed configuration(s), the plasma source region is created in a region of a chamber designed such that the magnetic field guides the plasma flux to the sample surface, but no line-of-sight exists between the plasma source region and the sample surface. The high energy photon flux (which is emitted from the source region) is blocked from striking the sample surface by the chamber walls, baffles, or other means. The plasma flux is, however, guided past these barriers to the sample by the magnetic field lines which are formed so as to circumvent such barriers. Many alternative topological configurations for the embodiment of FIGS. 1–3 therefore exist.

In the present invention, the specimen is positioned in an axisymmetric configuration on a plane which is perpendicular to the common axis of symmetry. A finite region is established where the plasma is generated, i.e., the source region. Two possibilities exist. Either there exists a line-of-sight from the specimen surface to the source region, or there exists no line-of-sight. All previous art is characterized by the existence of a line-of-sight from the specimen to the plasma source region. In the present configuration, there is no such line-of-sight.

In particular, consider the group of field lines which lie infinitesimally close to the axis of symmetry and are directed away from the specimen surface. Also consider configurations in which these field lines pass through the source region before encountering a material object. These field lines will remain infinitesimally close to the axis until the magnet field strength on the axis vanishes (the null point). In the present invention, the null point lies between the specimen and the source region. This enables the field lines which lie infinitesimally close to the axis to diverge away from the axis and pass through a source region which lies away from the axis and can therefore be hidden from direct line-of-sight to the wafer. A whole class of configurations is therefore possible having this property by deforming the magnetic field lines and moving the source region along the field lines retaining the property that the null point on the axis lies between the wafer and the source region on field lines which lie infinitesimally close to the axis.

Figure 6:
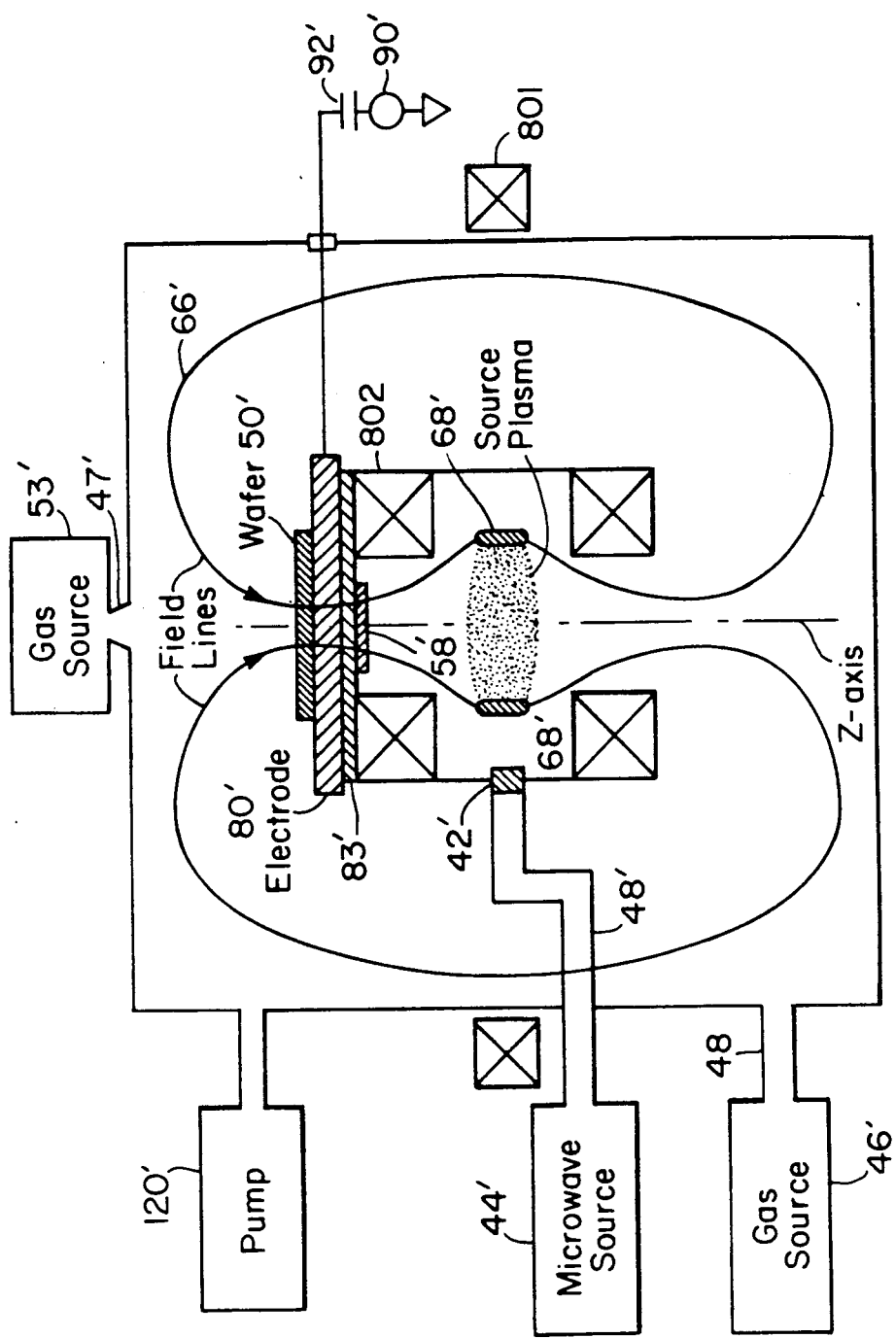
FIG. 6 is a schematic cross-section of another alternate reactor configuration in which the source region lies directly beneath the specimen.

For example, in the configuration shown in FIG. 1, a toroidal plasma source is created laterally below the wafer and is guided along the poloidal field lines through the baffle 60 to the wafer; thus, the lower vertical chamber wall 80 and baffle 60 act as shields or barriers to the high-energy photons. A variant on this is shown schematically in FIG. 6, in which the source region 68' lies directly opposite and below the wafer 50'. Such a plasma source is similar to that of a conventional ECR reactor; however, the plasma flows in the opposite direction, i.e., in the direction of the arrows along the field lines 66' exterior to the source region 68' and to the sample wafer 50' mounted in a similar position. The solenoidal coils 802 and 803 form an axial "magnetic mirror" in the source 68' where microwaves are introduced from source 44' through waveguide 43' and window 42'. The field lines which leave the mirror circle back and strike the wafer 50'. The function of the outer coil 801 is to compress and contain the flux within the vacuum chamber. Trim coils underneath the electrode are not shown in this figure, but can be incorporated to improve the uniformity. Note that like items in FIG. 6, corresponding to items in FIG. 1, carry the same numeral with a prime suffix and need not be further described herein.

The gas sources 46' and 53' are coupled, as in FIG. 1, to the respective chambers via conduits 48' and 47', respectively, and pump 120' maintains a flow of reactants. RF source 90' biases electrode 80' through capacitor 92'. The plasma generating chamber 40' is defined by the enclosure about the coils 802 and 803. Note that insulators 83' are provided similar to the insulators 83 in FIG. 1 to electrically isolate the electrode 80.

The source region 68' could also be formed at any position along the flux bundle in an apparatus similar to that shown in FIG. 1 by adjusting the number, powers, positions, sizings, etc. of the electromagnets such that an advantageous magnetic configuration is formed for the coupling of the microwave power into the plasma. For example, the plasma source region could be created in the position which is the baffle region of FIG. 1.

Figure 7:
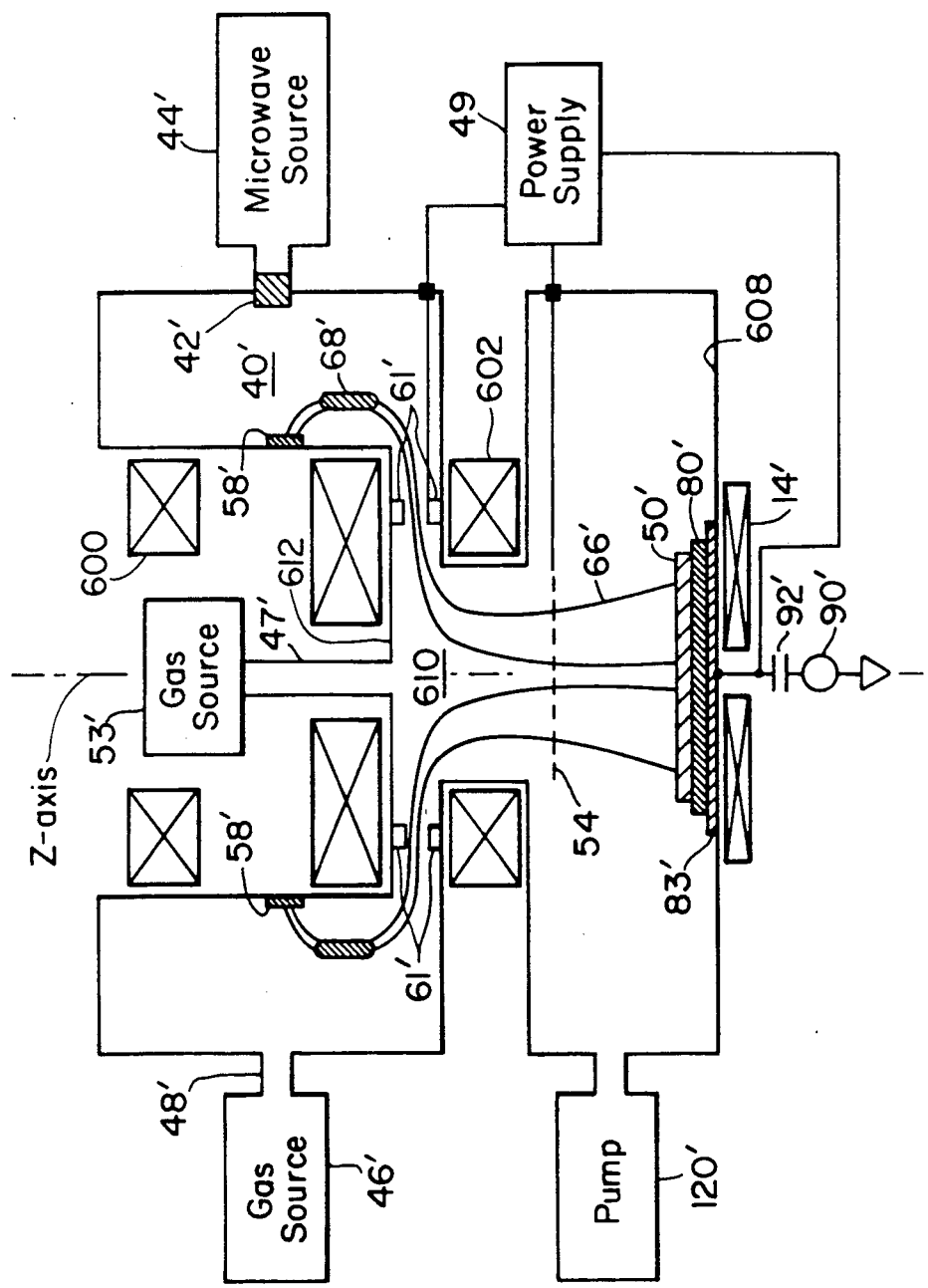
FIG. 7 shows a schematic representation of a cross-section of an ECR chamber which is a second embodiment of the present invention.

Another alternate embodiment to that of FIG. 1 will be described in connection with FIGS. 7 and 8 and Table 2. In FIG. 7, a "bucking" magnetic configuration is shown in which a bucking coil 601 is positioned in the center of a solenoidal magnetic configuration comprising magnets 600 and 602. The "bucking" coil creates magnetic field lines which oppose that of the primary solenoidal magnets, thereby creating a magnetic mirror in a toroidal region 68' in the plane of the bucking magnet 601, which is perpendicular to the axis of symmetry "Z" of the magnetic field 66'.

In the FIG. 7 embodiment, the plasma generating chamber 40' is located above the specimen chamber 30'. The toroidal chamber 40' is coupled to the specimen chamber via central passageway 610. Baffles 61' can be formed across passageway 610 to better define the flux bundle, to separate the source and specimen chambers, and to confine the microwaves to the source chamber. The bucking coil 601 is located coaxial to the central passageway. The wafer 50' is mounted on electrode 80' on bottom wall 608 of cylindrical specimen chamber 30' and is electrically insulated therefrom by insulator 83'. The field lines 66' extend from wafer 50' through the baffles 61 and passageway 610 to source region 68', by-passing lower wall 612 of chamber 40', and "terminate" on terminating surface 58'. Microwaves 44' are introduced into the source chamber 40' via window 42'. Gas source 46' and 43' are coupled to chambers 40' and passageway 610, respectively, via conduits 48' and 47'. Pump 120' is coupled to specimen chamber 30'. Optionally, a broad ion beam could be formed by placing a conducting grid 54 between the plasma generating chamber 40 and the specimen electrode 80 and biasing the specimen and the grid with electrical potentials from power supply 49. The baffles 61' can also be electrically biased, as shown in FIG. 7, in order to modify the energetics and composition of the plasma as it streams from the source region.

Note that like items in FIG. 7, corresponding to items in FIG. 1, carry the same numeral with a prime suffix and need not be further described herein.

Figure 8:
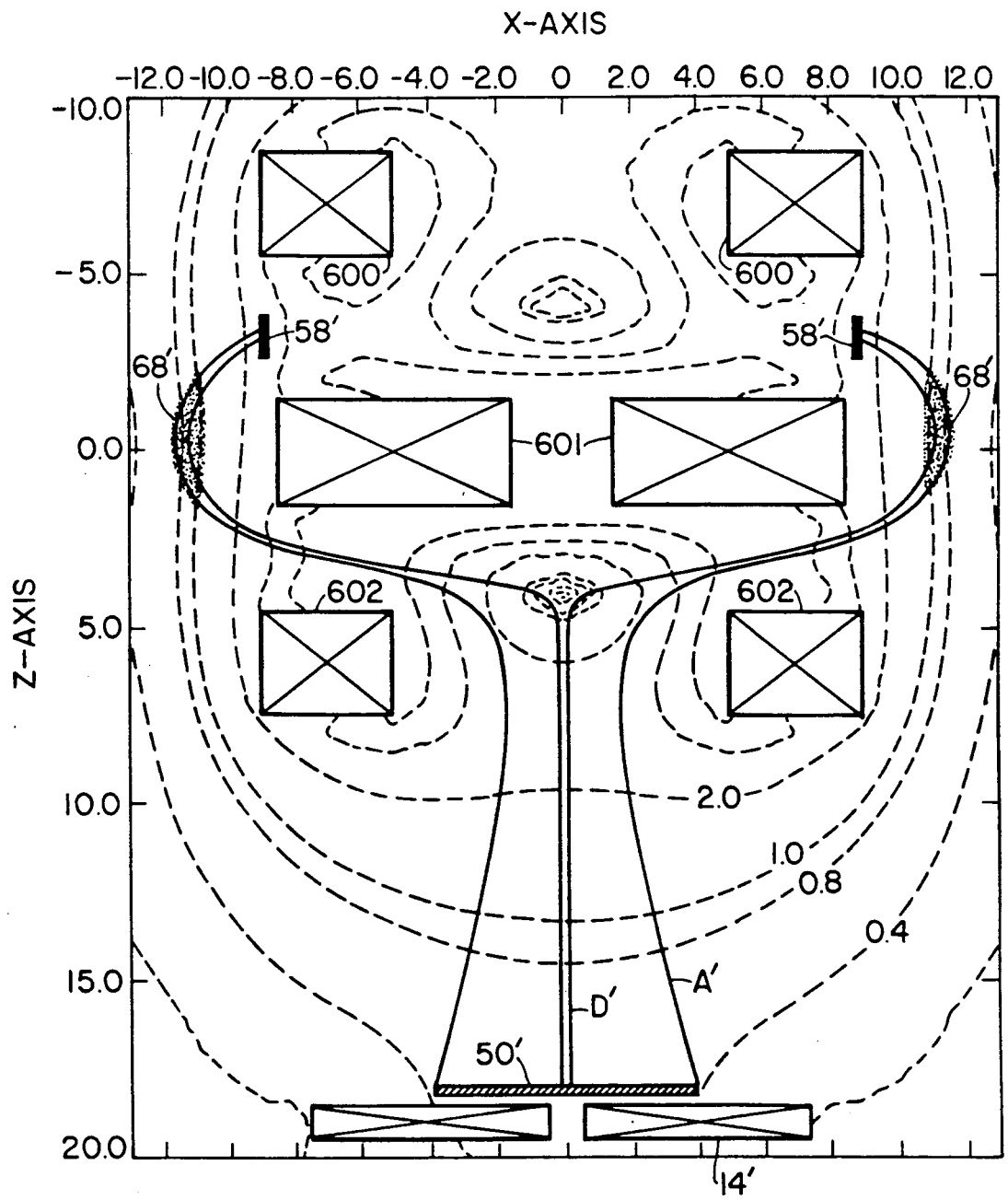
FIG. 8 is a diagram showing the magnetic field lines and modulus B contours for a magnet set and reactor of FIG. 7.

FIG. 8 shows the field lines and modulus B contours for the configuration of FIG. 7. As in FIG. 1, all coils are solenoidal and are mounted along a common axis of symmetry, the z axis. Coils 600 and 602 have currents in the same direction and by themselves would create a purely solenoidal simple axial "magnetic mirror". The presence of the bucking coil 601 fundamentally alters this configuration by introducing two magnetic nulls at approximately $z=4$ inches, $x=0$ and $z=-4$ inches, $x=0$. The set of field lines which "originates" at the wafer (the flux bundle), is "parted" at the null and diverted away from the axis of symmetry into the source region 68', as shown by lines D' and A', where microwave energy is introduced and where the coil currents are adjusted so that the flux bundle intersects the resonance modulus of B contour. This coil configuration forms a natural axial "magnetic mirror" in the source region and the termination plate 58' is at a lower modulus B than the baffle region between coils 601 and 602, allowing the more energetic electrons to preferentially strike the termination plate rather than the wafer.

As with the configuration of FIG. 1 the coil currents can be uniformly increased or decreased in order to vary the intersection of the resonant modulus B contour and the flux bundle to enhance plasma production either on field lines which map to the wafer center, or to the wafer edge. This sweeping of the resonance across the flux bundle can be controlled so that the time average flux to the wafer is uniform.

The uniformity trim coils 14' (shown here for convenience as a single coil) are adjusted in order to adjust the angle of the magnetic field lines with the wafer and the variation of modulus B across the wafer.

The configuration is azimuthally symmetric about the z axis. All dimensions are in inches and the modulus B contours are in kiloGauss. Note that the 875 G contour at which electrons have a cyclotron resonance is highlighted to indicate the source region 68'. The intersection of the cyclotron resonance modulus B contour with the flux bundle is the center of the plasma source region 68' which in this configuration (as shown in FIG. 7) does not lie within a line-of-sight of the wafer 50', since lower wall 612 extends across the line-of-sight between the source region 68' and the wafer 50'.

Table 2 below gives the coil locations and currents for the field lines and modulus B contours shown in FIG. 8. The coil numbers in the first column refer to the labels in FIG. 7. The z axis is the axis of azimuthal symmetry. The coils are all solenoids whose centers lie on the z axis. The second column gives the position of the center of the coil along the z axis, the third column give the radius of the coil cross-section centroid, the fourth column gives the axial width of the coil along the z axis, the fifth column gives the radial width of the coil, and the sixth column gives the current density of the coil in $A/in^2$. The dimensions for the coil locations are in inches. The coil currents shown are for a typical case.

TABLE 2

| 1<br>Coil # | 2<br>z | 3<br>r | 4<br>δz | 5<br>δr | 6<br>J |
|---|---|---|---|---|---|
| 600 | −7.0 | 7.0 | 3.0 | 4.0 | 9000. |
| 601 | 0.0 | 5.0 | 3.0 | 7.0 | −9000. |
| 602 | 6.0 | 7.0 | 3.0 | 4.0 | 9000. |

TABLE 2-continued

| 1<br>Coil # | 2<br>z | 3<br>r | 4<br>δz | 5<br>δr | 6<br>J |
|---|---|---|---|---|---|
| 14' | 19.0 | 4.0 | 1.0 | 7.0 | 500 |

In all the above configurations, in order to produce a uniform plasma flux at the sample, the magnetic fields along which the plasma flows could be tailored by magnets beneath the specimen and the resonance location can be dynamically swept. By suitable construction of the chamber walls and/or baffles, the source region 68' could be isolated from the line-of-sight of the sample.

Excitation schemes other than ECR (as strictly defined) can be used in the proposed ECR reactors to excite the plasma source. For example, whistler wave, near-field or evanescent wave heating, second harmonic heating, or off-resonance heating, have been demonstrated in conventional ECR reactors and could be applied in these configurations.

Equivalents

This completes the description of the preferred embodiments of the invention. Many alternatives and modification thereof will become apparent to those skilled in the art. Accordingly, such equivalents are intended to be encompassed within the scope of the following claims.

We claim:
1. A reactor comprising:
   (a) a plasma generating chamber in which a plasma, comprised of electrical particles, is formed in a plasma source region;
   (b) magnet means for generating a poloidal magnetic field having a cylindrical axis of symmetry extending through the chamber;
   (c) microwave generating means for generating microwave fields in said plasma generating chamber;
   (d) a source of gaseous reactants for supplying gaseous reactants to said plasma generating chamber;
   (e) a specimen chamber adjacent said plasma generating chamber with a holding member adapted to hold specimens for processing and structure between the specimen and the plasma generating chamber for blocking the line-of-sight so that the specimen, when so held, is not in line-of-sight with the plasma source region;
   (f) a passageway between said specimen chamber and said plasma generating chamber through which said plasma is introduced into said specimen chamber;
   (g) pump means for controlling the flow of gaseous reactants into and out of the chamber;
   (h) the interaction between said magnetic field and microwave field with said reactants producing said plasma, said magnetic field extending from said source region to said electrode for guiding particles in the plasma until they encounter the specimen.

2. The reactor of claim 1 wherein the plasma generating chamber is below the specimen chamber.

3. The reactor of claim 1 wherein a magnetic mirror is formed in the plasma generating chamber and the plasma source region is located within said mirror.

4. The reactor of claim 1 wherein the plasma generating chamber is cylindrical and the axis of symmetry of the poloidal field is coincident to a longitudinal axis of the cylindrical chamber.

5. The reactor of claim 1 wherein the plasma source region is formed adjacent said axis and the holding member is located on said axis above said plasma generating chamber.

6. The reactor of claim 1 including coils mounted adjacent the holding member for adjusting the modulus of the magnetic field across the specimen.

7. The reactor of claim 1 including means for varying the magnetic field to selectively control the profile of the plasma.

8. The reactor of claim 1 wherein the microwave generating means includes a coaxially-fed shorted loop antenna.

9. The reactor of claim 1 including a terminating surface upon which the high-energy electrons are allowed to impinge to evaporate material from said surface for deposition on said specimen.

10. The reactor of claim 9 wherein the material is a metal.

11. The reactor of claim 10 wherein the metal is aluminum.

12. The reactor of claim 1 further comprising gas means for introducing gaseous elements directly into the specimen chamber for reaction with said specimen.

13. The reactor of claim 12 wherein the gaseous elements are in an excited state prior to introduction.

14. The reactor of claim 1 wherein the magnet means comprises solenoid coils through which current runs and the magnitude of such current is varied to selectively control the profile of the plasma particles guided to the specimen.

15. The reactor of claim 14 wherein the magnetic field comprises lines of force which intersect with modulus B contours and at such intersection a resonance condition occurs between the microwave fields and the electrical particles an wherein varying the current through said coil varies the intersection.

16. The reactor of claim 15 wherein the coil current is varied so as to cause the intersection to occur at a harmonic of the resonant condition.

17. The reactor of claim 16 wherein resonance is at the second harmonic using 2.45 GHz microwave and a 437.5 kiloGauss magnetic field.

18. The reactor of claim 1 wherein a grid is placed between the specimen and the plasma generating chamber and the specimen and grid are biased with electrical potentials.

19. The reactor of claim 9 wherein reactant gasses are also introduced into the specimen chamber.

20. The reactor of claim 1 wherein the holding member is an electrode which is electrically biased to accelerate particles toward said electrode.

21. The reactor of claim 1 wherein the plasma contains high energy particles which are substantially confined in the plasma generating chamber and the other particles are selectively guided to the specimen.

22. The reactor of claim 1 wherein the plasma generating chamber is located above the specimen chamber and is generally toroidal in shape and the passageway extends from the bottom of the plasma generating chamber to the top of the specimen chamber.

23. A method for processing a specimen comprising the steps of:
(a) forming a plasma comprising electrical particles in a plasma generating chamber which plasma is contained in a plasma source region;

(b) generating a poloidal magnetic field having a cylindrical axis of symmetry extending through the chamber;
(c) generating microwave fields and coupling said fields to said plasma;
(d) coupling gaseous reactants to said plasma generating chamber;
(e) holding said specimen on a holding member in a specimen chamber for processing and in which the specimen, when so held, is out of line-of-sight with the plasma source region;
(f) coupling said plasma to said specimen;
(g) the interaction between said magnetic field and microwave field producing said plasma, said magnetic field extending from said source region to said electrode for guiding particles in the plasma to the specimen.

24. The method of claim 23 wherein the plasma generating chamber is located below the specimen chamber.

25. The method of claim 23 wherein a magnetic mirror is formed in the plasma generating chamber and the plasma source region is located within said mirror.

26. The method of claim 23 wherein the plasma generating chamber is cylindrical and the axis of symmetry of the poloidal field is coincident to a longitudinal axis of the cylindrical chamber.

27. The method of claim 23 wherein the plasma source region is formed adjacent said axis and the holding member is located on said axis above said plasma generating chamber.

28. The method of claim 23 wherein magnetic resonance is established in the plasma generating chamber.

29. The method of claim 23 wherein the plasma contains high energy particles which are substantially confined in the plasma generating chamber and the other particles are selectively guided to the specimen.

30. A reactor comprising:
(a) a plasma generating chamber in which a plasma, comprised of electrical particles, is formed in a plasma source region;
(b) magnet means for generating a poloidal magnetic field having a cylindrical axis of symmetry extending through the chamber;
(c) microwave generating means for generating microwave fields in said plasma generating chamber;
(d) a source of gaseous reactants for supplying gaseous reactants to said plasma generating chamber;
(e) a specimen chamber adjacent said plasma generating chamber with an electrode adapted to hold specimens for processing and in which the specimen, when so held, is not in line-of-sight with the plasma source region;
(f) a passageway between said specimen chamber and said plasma generating chamber through which said plasma is introduced into said specimen chamber, said passageway comprising a baffle region with baffles extending transverse said passageway comprising a baffle region with baffles extending transverse said passageway and further comprised of an annular opening being in the form of rings extending along the cylindrical axis between the two chambers, said annular opening so constructed as to create a pressure differential between the two chambers for cooling energetic particles and confining microwave energy to the plasma generating chamber;

(g) pump means for controlling the flow of gaseous reactants into and out of the chamber;

(h) the interaction between said magnetic field and microwave field with said reactants producing said plasma, said magnetic field extending from said source region to said electrode for guiding particles in the plasma until they encounter the specimen.

31. The reactor of claim 30 wherein the baffles are electrically biased to modify the plasma stream.

32. The reactor of claim 30 wherein the rings are formed from graphite.

33. A reactor comprising:

(a) a plasma generating chamber in which a plasma, comprised of electrical particles, is formed in a plasma source region;

(b) magnet means for generating a poloidal magnetic field having a cylindrical axis of symmetry extending through the chamber;

(c) microwave generating means for generating microwave fields in said plasma generating chamber;

(d) a source of gaseous reactants for supplying gaseous reactants to said plasma generating chamber;

(e) a specimen chamber adjacent said plasma generating chamber with an electrode adapted to hold specimens for processing and in which the specimen, when so held, is not in line-of-sight with the plasma source region;

(f) a passageway between said specimen chamber and said plasma generating chamber through which said plasma is introduced into said specimen chamber;

(g) pump means for controlling the flow of gaseous reactants into and out of the chamber;

(h) the interaction between said magnetic field and microwave field with said reactants producing said plasma, said magnetic field extending from said source region to said electrode for guiding particles in the plasma until they encounter the specimen; and (i) a terminating surface in the plasma generating chamber and wherein the microwave fields form modulus B contours and the modulus B in the passageway is higher than at the terminating surface causing a preferential loss of high-energy particles at said terminating surface.

* * * * *

UNITED STATES PATENT AND TRADEMARK OFFICE
CERTIFICATE OF CORRECTION

PATENT NO. : 5,061,838
DATED : Oct. 29, 1991
INVENTOR(S) : Barton G. Lane, Herbert H. Sawin and Donna L. Smatlak It is certified that error appears in the above-identified patent and that said Letters Patent is hereby corrected as shown below:

Col. 15, line 37, delete "an" and insert ---and---.

Signed and Sealed this

Tenth Day of August, 1993

Attest:

MICHAEL K. KIRK

*Attesting Officer*     Acting Commissioner of Patents and Trademarks